US005611861A

United States Patent [19]
Higashi

[11] Patent Number: 5,611,861
[45] Date of Patent: Mar. 18, 1997

[54] ROTARY TYPE APPARATUS FOR PROCESSING SEMICONDUCTOR WAFERS AND METHOD OF PROCESSING SEMICONDUCTOR WAFERS

[75] Inventor: Kumiko Higashi, Kumamoto, Japan

[73] Assignee: NEC Corporation, Tokyo, Japan

[21] Appl. No.: 656,483

[22] Filed: May 31, 1996

[30] Foreign Application Priority Data

May 31, 1995 [JP] Japan .................................. 7-133677
[51] Int. Cl.$^6$ .................................................. C23C 16/00
[52] U.S. Cl. .................... 118/719; 204/298.25; 156/345; 29/25.01
[58] Field of Search ........................ 118/719; 204/298.25; 156/345; 29/25.01

[56] References Cited

U.S. PATENT DOCUMENTS

| | | | |
|---|---|---|---|
| 4,984,531 | 1/1991 | Zejda | 204/298.25 |
| 5,186,718 | 2/1993 | Tepman | 118/719 |
| 5,205,919 | 4/1993 | Zejda | 204/298.25 |

Primary Examiner—Richard Bueker
Attorney, Agent, or Firm—Foley & Lardner

[57] ABSTRACT

The present invention provides a semiconductor wafer processing apparatus including (a) N process chambers for processing a semiconductor wafer therein wherein N is a positive integer greater than 1, the N process chambers being rotatably disposed in a circle having a first diameter and circumferentially equally spaced away from each other, (b) at least one pair of wafer transferring devices for transferring a semiconductor wafer into and taking a semiconductor wafer out of one of the N process chambers, the wafer transferring devices being disposed in a circle having a second diameter greater than the first diameter, the wafer transferring devices being circumferentially equally spaced away from each other at the same spacing as the N process chambers, and (c) a driver for rotating the N process chambers so that any two process chambers among the N process chambers face to the wafer transferring devices. The semiconductor wafer processing apparatus makes it possible to concurrently transfer and process semiconductor wafers, thereby enhancing a throughput without causing a semiconductor wafer to wait to be processed.

24 Claims, 3 Drawing Sheets

ROTARY TYPE APPARATUS FOR PROCESSING SEMICONDUCTOR WAFERS AND METHOD OF PROCESSING SEMICONDUCTOR WAFERS

BACKGROUND OF THE INVENTION

1. FIELD OF THE INVENTION

The invention relates to a semiconductor wafer processing apparatus for carrying out a variety of processing such as etching and film-depositing to a semiconductor wafer, and more particularly to a semiconductor wafer processing apparatus for successively carrying out processing such as etching and film-depositing to a plurality of semiconductor wafers. The invention also relates to a method of successively processing a plurality of semiconductor wafers.

2. DESCRIPTION OF THE PRIOR ART.

With higher integration in a semiconductor device, there has been rapidly developed techniques for higher densification by making patterns as small as possible. For instance, it is now necessary to process a pattern at half-micron level for large-volume production. Such a development in techniques for higher densification demands an etching step, which is one of steps for forming fine patterns, to be carried out with higher accuracy and also with higher throughput.

As one of apparatuses for carrying out etching is known a dry etching apparatus. In general, a dry etching apparatus includes two circular-plate shaped electrodes disposed in parallel with each other in a vacuum chamber with reactive gas being filled between the electrodes. One of electrodes is electrically connected to a high frequency power source through a blocking Capacitor, and the other is grounded. There is produced plasma between the electrodes by applying high frequency voltage to the electrode. A surface of the electrode to which high frequency power is applied is negatively biased. Positively charged ions in plasma are accelerated by the voltage, and hence are made to radiate perpendicularly to a semiconductor wafer. Thus, a semiconductor wafer is anisotropically etched by the thus made ion bombardment.

A conventional dry etching apparatus as mentioned above is a batch type for processing a plurality of wafers at a time. Though a batch type apparatus has a great processing rate, it is difficult for a batch type apparatus to uniformly, accurately process a plurality of wafers placed in a chamber. On the other hand, there has been proposed an apparatus wherein every single semiconductor wafer is placed and processed in a small chamber in order to carry out more uniform processing. However, this type of apparatus is inferior to the above mentioned batch type in a processing rate.

There is known a multi-chamber type semiconductor wafer processing apparatus for carrying out a plurality of processes more rapidly. FIG. 1 is a cross-sectional view illustrating one of such semiconductor wafer processing apparatuses. As illustrated in FIG. 1, the multi-chamber type apparatus basically includes a wafer transfer chamber 35, three process chambers 33 each of which is connected to the wafer transfer chamber 35 through a gate valve 34, and two wafer load chambers 40 each of which is connected to the wafer transfer chamber 35 through a gate valve 37.

In the wafer transfer chamber 35 is defined a load rock chamber 36 through which the wafer transfer chamber 35 is connected to the wafer load chambers 40. In the wafer transfer chamber 35 are provided a wafer transfer arm 38a in the vicinity of the process chambers 33 and a wafer transfer arm 38b in the load rock chamber 40. In each of the wafer load chambers 40 is placed a wafer cassette 39 containing a plurality of wafers 32 therein. The wafer transfer arm 38b is designed to take a semiconductor wafer 32 out of the wafer cassette 39 one by one and deliver it to the wafer transfer arm 38a, and receive a processed semiconductor wafer from the wafer transfer arm 38a and transfer it into the wafer cassette 39. The wafer transfer arm 38a is designed to receive a semiconductor wafer 32 from the wafer transfer arm 38b and transfer it into one of the process chambers 33, and take out a semiconductor wafer 32 having been processed in the process chamber 33.

In the above described conventional multi-chamber type semiconductor wafer processing apparatus, wafers are transferred between the wafer transfer chamber 35 and the process chambers 33 by a pair of the wafer transfer arms 35a and 35b. Accordingly, even if semiconductor wafer processing is completed in a certain process chamber, the processed semiconductor wafer has to wait to be taken out of the process chamber while the wafer transfer arms 35a and 35b transfer another wafer. As a result, even if a plurality of process chambers are to be used, it is difficult to sufficiently increase a throughput.

SUMMARY OF THE INVENTION

In view of the foregoing problem of the prior art, it is an object of the present invention to provide a semiconductor wafer processing apparatus which is capable of providing uniformity in wafer processing and increasing a throughput.

In one aspect, the present invention provides a semiconductor wafer processing apparatus including (a) N process chambers for processing a semiconductor wafer therein wherein N is a positive integer greater than 1, the N process chambers being disposed in a circle having a first diameter and circumferentially spaced away from each other by 360/N degrees, the N process chambers being supported for rotation about a center of the circle, (b) at least one pair of wafer transferring devices for transferring a semiconductor wafer into one of the N process chambers and taking a semiconductor wafer out of one of the N process chambers, the wafer transferring devices being disposed in a circle having a second diameter greater than the first diameter, the wafer transferring devices being circumferentially spaced away from each other by 360M/N degrees wherein M is a positive integer ranging from 1 to (N−1) both inclusive, and (c) a driver for rotating the N process chambers about the center so that any two process chambers among the N process chambers face to the wafer transferring devices.

One of the pair of wafer transferring devices may be designed to only transfer a semiconductor wafer into one of the N process chambers, and the other only take a semiconductor wafer out of one of the N process chambers. The pair of wafer transferring devices may be designed to be the same in structure.

For instance, the driver rotates the N process chambers by 360/N degrees in clockwise and counterclockwise directions.

It is preferable that the semiconductor wafer processing apparatus further includes a vacuum device for evacuating the N process chambers, a main manifold standing at the center of the circle and branch manifolds each of which communicates the main manifold to each of the N process chambers. The main manifold is connected to the vacuum device through a rotary joint in hermetically sealed fashion.

Each of the wafer transferring devices has a portion capable of extending to one of the N process chambers to make contact therewith to communicate the wafer transferring device to the one of the N process chambers, and drawing from one of the N process chambers to make spacing therebetween. For instance, such a portion is comprised of a bellows.

The present invention further provides a semiconductor wafer processing apparatus including (a) N process chambers for processing a semiconductor wafer therein wherein N is an even integer greater than 1, the N process chambers being disposed in a circle having a first diameter and circumferentially spaced away from each other by 360/N degrees, the N process chambers being supported for rotation about a center of the circle, (b) N/2 wafer transferring devices for transferring a semiconductor wafer into one of the N process chambers and taking a semiconductor wafer out of one of the N process chambers, the wafer transferring devices being disposed in a circle having a second diameter greater than the first diameter, the wafer transferring devices being circumferentially spaced away from each other by 720/N degrees and disposed facing to alternately disposed process chambers among the N process chambers, and (c) a driver for rotating the N process chambers about the center in opposite directions.

The present invention still further provides a semiconductor wafer processing apparatus including (a) a plurality of process chambers disposed in a circle for processing a wafer therein, each of the process chambers including a first gate valve through which a wafer is transferred thereinto and a wafer is taken out thereof, and a valve for communicating each of the process chambers to outside, the process chambers being circumferentially equally spaced away from each other, (b) a main manifold standing at a center of the circle, all of the valves being communicated to the main manifold, (c) a vacuum device rotatably connected to the main manifold in hermetically sealed fashion for evacuating the process chambers through the main manifold and the valves, (d) positioning means for positioning the process chambers by rotating the process chambers about the center of the circle and stopping the process chambers at a predetermined position, (e) a pair of wafer transfer chambers for transferring a semiconductor wafer into one of the process chambers therethrough and taking a semiconductor wafer out of one of the process chambers therethrough, each of the wafer transfer chambers including a second gate valve located in facing relation to the first gate valve of the process chamber positioned by the positioning means, and a third gate valve at a rear end of the wafer transfer chambers, (f) extensible and contractible bellows connected to the second gate valves for connecting the first gate valves to the second gate valves and disconnecting the first gate valves from the second gate valves in hermetical sealed fashion, and (g) a wafer transferring arm provided in each of the wafer transfer chambers for transferring a semiconductor wafer into one of the process chambers and taking a semiconductor wafer out of one of the process chambers, and also for transferring a semiconductor wafer to outside through the third gate valve and taking a semiconductor wafer from outside thereinto.

The semiconductor wafer processing apparatus may further include an elevator for transferring a plurality of semiconductor wafers to the wafer transfer chamber.

In another aspect, the present invention provides a method of processing a semiconductor wafer including the steps of (a) preparing N process chambers for processing a semiconductor wafer therein wherein N is a positive integer greater than 1, the N process chambers being disposed in a circle and circumferentially spaced away from each other by 360/N degrees, the N process chambers being supported for rotation about a center of the circle, (b) transferring a semiconductor wafer at a first location into a first process chamber among the N process chambers, (c) rotating the N process chambers by 360M/N degrees wherein M is a positive integer ranging from 1 to (N−1) both inclusive, (d) carrying out processing of a semiconductor wafer in the first process chamber, (e) transferring a semiconductor wafer at the first position into a second process chamber among the N process chambers, (f) repeating the steps (c) to (e) for subsequent semiconductor wafers, (g) taking a processed semiconductor wafer out of the first process chamber at a second location which is circumferentially spaced away from the first location by 360L/N degrees wherein L is a positive integer ranging from 1 to (N−1) both inclusive, and (h) repeating the steps (b) to (g).

In the above mentioned method, it is preferable that the steps (d) and (e) are to be concurrently carried out.

The present invention further provides a method of processing a semiconductor wafer including the steps of (a) preparing N process chambers for processing a semiconductor wafer therein wherein N is an even integer greater than 1, the N process chambers being disposed in a circle and circumferentially spaced away from each other by 360/N degrees, the N process chambers being supported for rotation about a center of the circle, (b) transferring a semiconductor wafer into alternately disposed process chambers among the N process chambers when the N process chambers are in a first position, (c) rotating the N process chambers to a second position in a direction, (d) carrying out processing of a semiconductor wafer in the process chambers, (e) rotating the N process chambers in an opposite direction back to the first position, (f) taking processed semiconductor wafers out of the process chambers and transferring unprocessed semiconductor wafers into the process chambers, and (g) repeating the steps (c) to (f).

For instance, the N process chambers are rotated by 180/N degrees in the steps (c) and (e).

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

The first to third embodiments in accordance with the present invention will be explained hereinbelow with reference to drawings, in which the first and second embodiments show the concept of the present invention, and the third embodiment shows the detailed structure.

Figure 1:
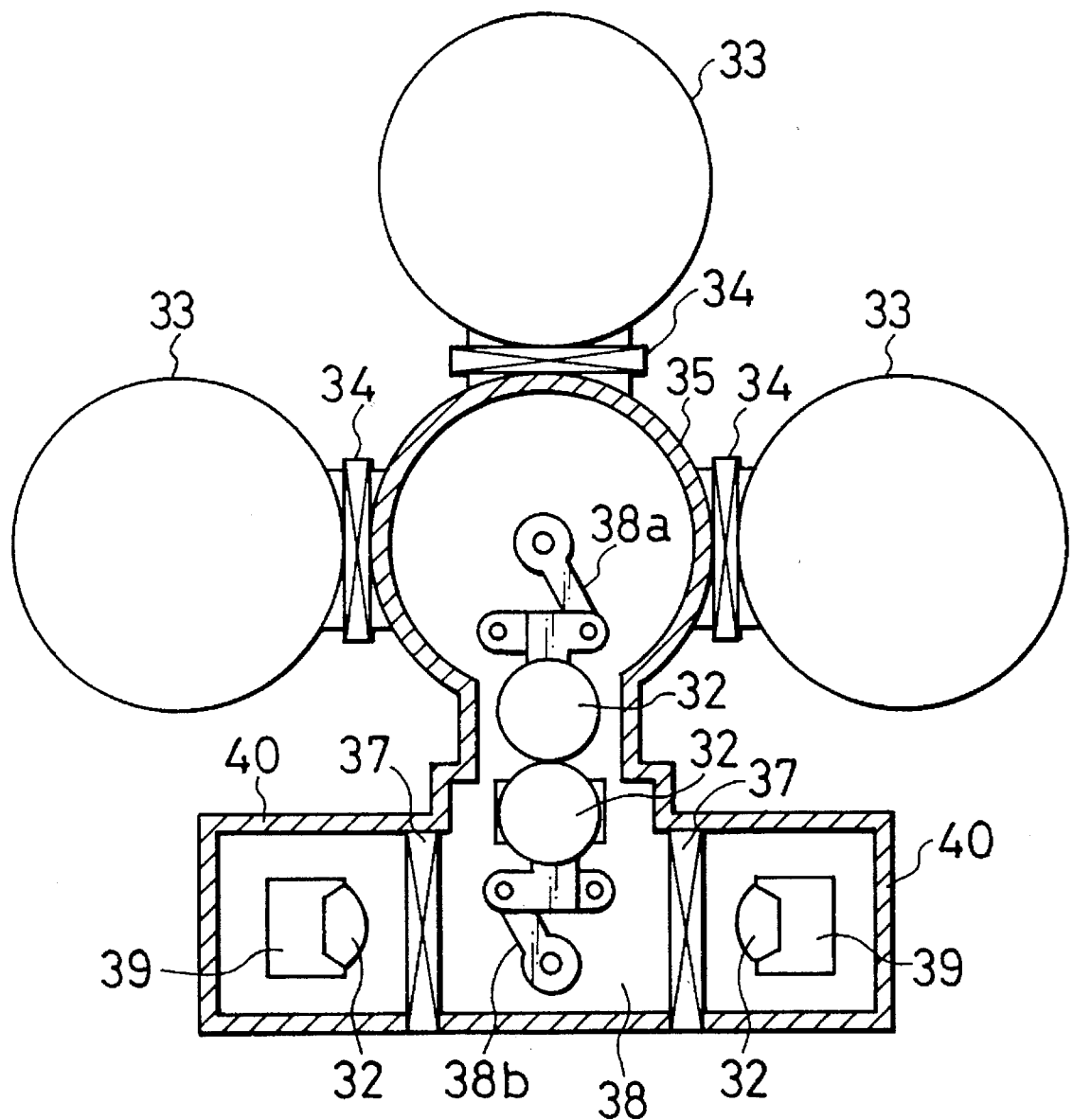
FIG. 1 is a cross-sectional view illustrating a conventional semiconductor wafer processing apparatus.
Figure 2:
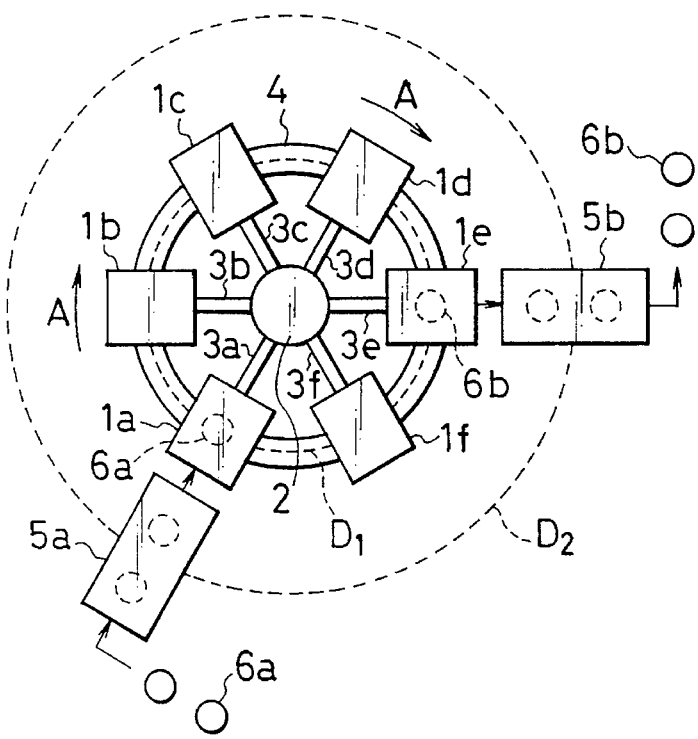
FIG. 2 is a schematic plan view illustrating a semiconductor wafer processing apparatus made in accordance with the first embodiment of the present invention.

Referring now to FIG. 2 illustrating the first embodiment of the invention, a semiconductor wafer processing apparatus includes six process chambers 1a to 1f in each of which there is to be carried out semiconductor wafer processing such as etching and film-depositing. These six process chambers 1a to 1f are disposed in a circle having a diameter $D_1$, and circumferentially equally spaced away from each other, namely circumferentially spaced away from each other by 60 degrees.

There stands a main manifold 2 at the center of the circle $D_1$ communicating to the process chambers 1a to 1f through branch manifolds 3a to 3f in hermetically sealed fashion. The main manifold 2 is connected to a vacuum device (not illustrated), and hence the process chambers 1a to 1f are kept vacuous by the vacuum device through the main and branch manifolds 2 and 3a to 3f.

The six process chambers 1a to 1f are supported on a rotary plate 4 so that they are rotated about a center of the circle $D_1$. A motor (not illustrated) connected to the rotary plate 2 rotates the rotary plate 2 in a direction indicated with an arrow A. The motor is controlled to rotate the rotary plate 2 and hence the process chambers 1a to 1f by 60 degrees at a time.

First and second wafer transferring devices 5a and 5b are disposed in a circle having a diameter $D_2$ greater than the diameter $D_1$. The wafer transferring devices 5a and 5b are circumferentially spaced away from each other by 120 degrees. Thus, the first and second wafer transferring devices 5a and 5b face to the process chambers 1a and 1e, respectively.

The first wafer transferring device 5a receives a plurality of semiconductor wafers 6a from a source (not illustrated), and transfers one of the received wafers into the process chamber 1a in hermetically sealed fashion, whereas the second wafer transferring device 5b takes a processed wafer 6b out of the process chamber 1a (as mentioned later, the process chamber 1a are rotated by 240 degrees, namely from the first wafer transferring device 5a to the second wafer transferring device 5b), and transfers the received processed wafer 6b to outside. For instance, each of the first and second wafer transferring devices 5a and 5b has a robot arm for carrying out the above mentioned function.

In operation, the first wafer transferring device 5a transfers a non-processed semiconductor wafer 6a into the process chamber 1a. Then, the motor (not illustrated) rotates the process chambers 1a to 1f by 60 degrees. The process chamber 1a is rotated to a location where the process chamber 1b used to be located, and the process chamber 1f is rotated to a location where the process chamber 1a used to be located. Then, the first wafer transferring device 5a transfers a non-processed wafer 6a into the process chamber 1f, and concurrently wafer processing such as etching is carried out in the process chamber 1a.

Then, the process chambers 1a to 1f are rotated by 60 degrees. Then, wafer processing is carried out in the process chamber 1f, and concurrently the first wafer transferring device 5a transfers a non-processed wafer to the process chamber 1e.

These steps are repeated until the process chamber 1a rotates to a location facing to the second wafer transferring device 5b. When the process chamber 1a containing a processed wafer 6b therein reaches facing to the second wafer transferring device 5b, the second wafer transferring device 5b takes the processed wafer 6b out of the process chamber 1a, and transfers the wafer 6b to outside.

When the empty process chamber 1a are rotated to a location facing to the first wafer transferring device 5a, the first wafer transferring device 5a again transfers a non-processed semiconductor wafer 6a into the process chamber 1a.

It should be noted that the number of the process chambers is not to be limited to six (6), but includes any number greater than one (1).

Thus, the semiconductor wafer processing apparatus made in accordance with the first embodiment makes it possible to successively carry out wafer processing unlike a conventional wafer processing apparatus wherein a wafer having already been processed has to wait to be taken out of a process chamber while the wafer transfer arms transfer another wafer. In addition, it is not always necessary that the same processing is to be carried out in the process chambers 1a to 1f. Various kinds of processing may be carried out. For instance, first etching, second etching and film-depositing may be carried out in the process chamber 1a, 1b, 1c, respectively.

Figure 3:
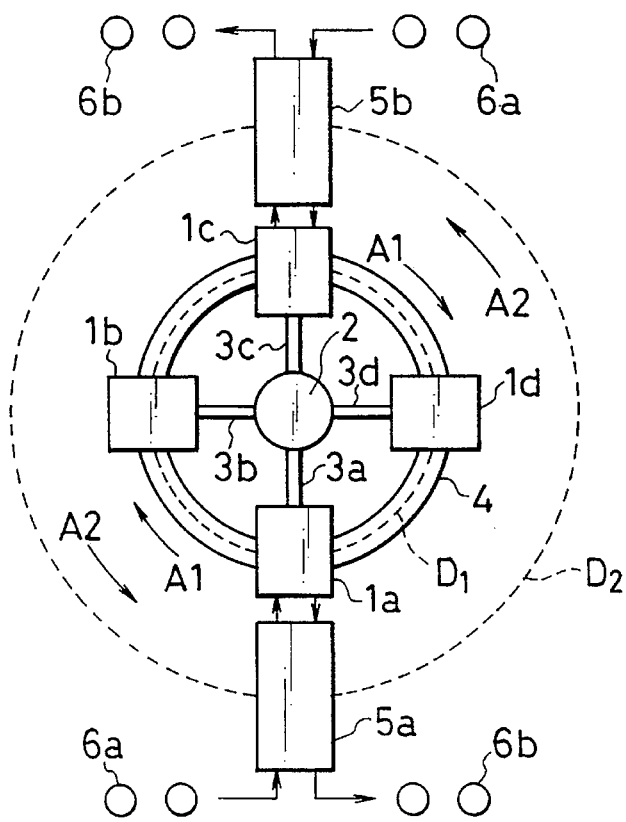
FIG. 3 is a schematic plan view illustrating a semiconductor wafer processing apparatus made in accordance with the second embodiment of the present invention.

FIG. 3 illustrates a semiconductor wafer processing apparatus made in accordance with the second embodiment of the invention. Parts or elements corresponding to those of the first embodiment have been provided with the same reference numerals. The semiconductor wafer processing apparatus of the second embodiment has similar structure as the first embodiment, but is different in that there are arranged four process chambers 1a to 1d, and the first and second wafer transferring devices 5a and 5b are disposed facing to the alternately disposed process chambers, for instance, the process chambers 1a and 1c, respectively.

It should be noted that it is necessary in the second embodiment to arrange the N process chambers wherein N is an even number, and the N/2 wafer transferring devices. Though the second embodiment has the four process chambers 1a to 1d and the two wafer transferring devices 5a and 5b, the numbers of the process chambers and the wafer transferring devices are not to be limited to four and two, but may be selected among other even numbers.

In operation, the first and second wafer transferring devices 5a and 5b transfer a non-processed semiconductor wafer 6a into the process chambers 1a and 1c, respectively. Then, the motor (not illustrated) rotates the process chambers 1a to 1d by 90 degrees in a direction indicated with an arrow A1. The process chamber 1a is rotated to a location where the process chamber 1b used to be located, and the process chamber 1c is rotated to a location where the process chamber 1d used to be located. The process chambers 1d and 1b are rotated to a location facing to the first and second wafer transferring devices 5a and 5b.

Then, the first wafer transferring device 5a transfers a non-processed wafer 6a into the process chamber 1d, and concurrently wafer processing such as etching is carried out in the process chamber 1a. At the same time, the second wafer transferring device 5b transfers a non-processed wafer 6a into the process chamber 1b, and concurrently wafer processing is carried out in the process chamber 1c.

Then, the process chambers 1a to 1d are rotated by 90 degrees in a direction indicated with an arrow A2, namely a direction opposite to the direction A1. Thus, the process chambers 1a to 1d return to their original position as illustrated in FIG. 3. Namely, the process chambers 1a and 1c are disposed facing to the first and second wafer transferring devices 5a and 5b. The first and second wafer transferring devices 5a and 5b take processed wafers 6b out of the process chambers 1a and 1c, respectively, and then transfer a new non-processed semiconductor wafer into the process chambers 1a and 1c.

While the first and second wafer transferring devices 5a and 5b take the processed wafers 6b out of the process chambers 1a and 1c, wafer processing is carried out in each of the processing chambers 1b and 1d at a location illustrated in FIG. 3.

The steps as mentioned above are repeated in desired numbers. Thus, the semiconductor wafer processing apparatus made in accordance with the second embodiment makes it possible to successively carry out wafer processing, similarly to the first embodiment. Similarly to the first embodiment, the second embodiment makes it possible to carry out various kinds of wafer processing. For instance, etching may be carried out in the process chambers 1a and 1c, and film-depositing may be carried out in the process chambers 1b and 1d.

Figure 4A:
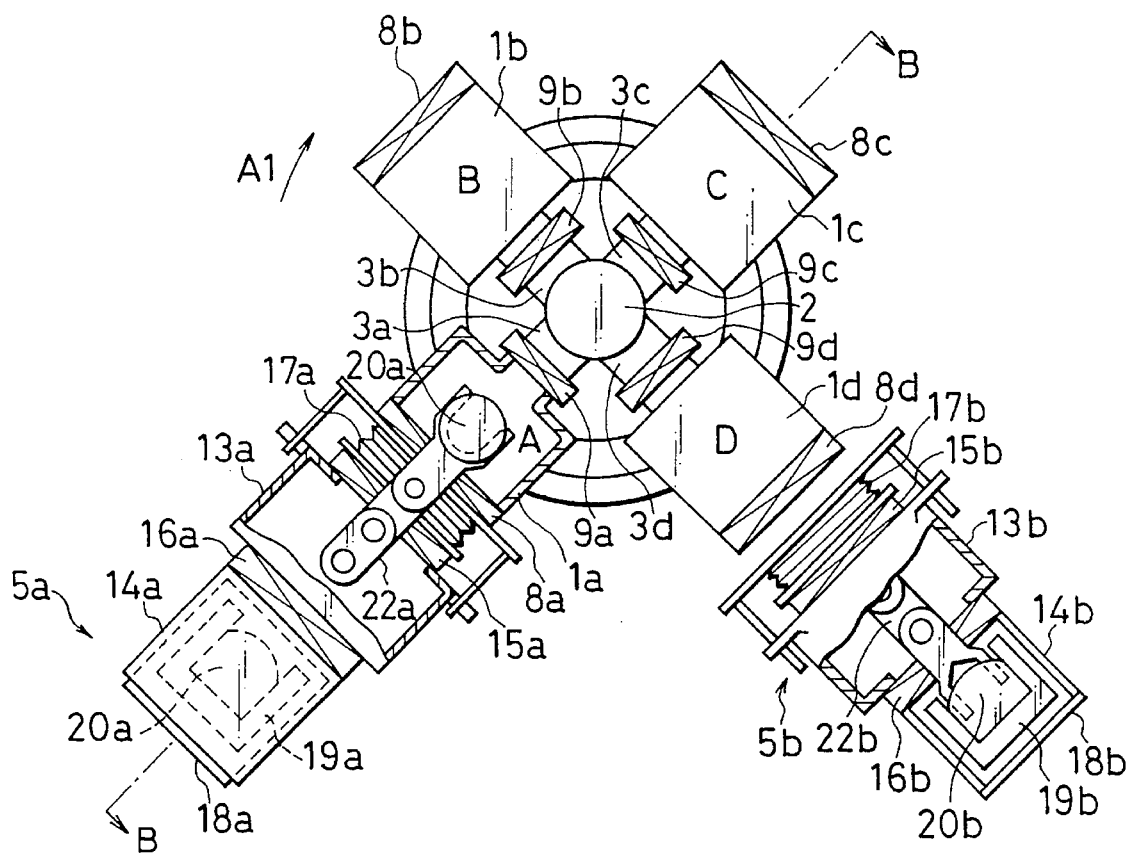
FIG. 4A is a plan view illustrating a semiconductor processing apparatus made in accordance with the third embodiment of the present invention with portions removed away for the sake of clarity.
Figure 4B:
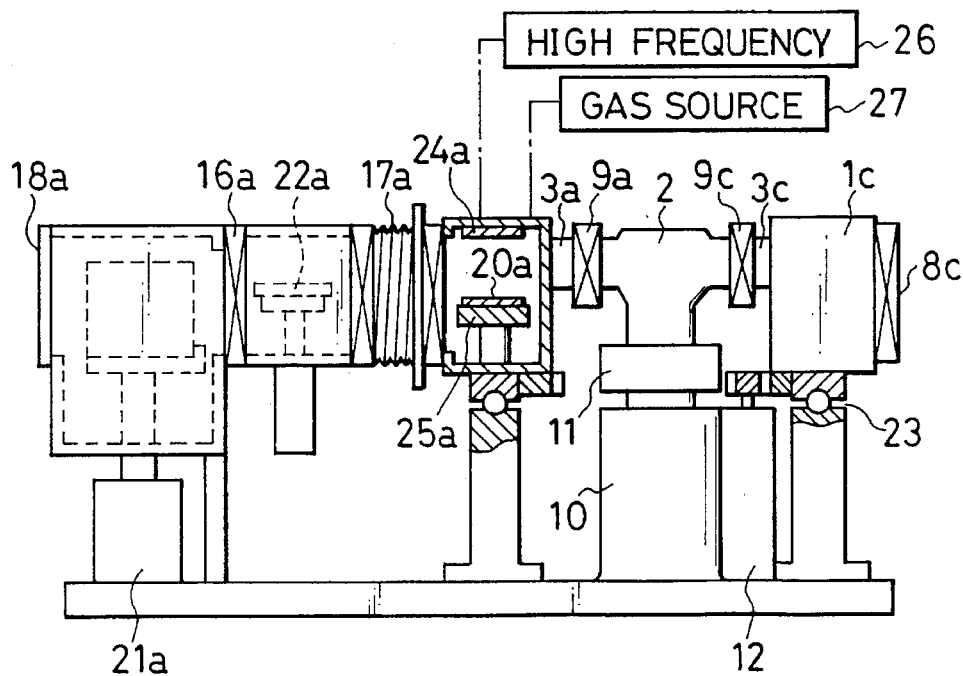
FIG. 4B is a cross-sectional view taken along the line B—B in FIG. 4A.

Turning to FIGS. 4A and 4B, the third embodiment of the invention will be described hereinbelow. In the following description, parts corresponding to the first and second embodiments have been provided with the same reference numerals. A semiconductor wafer processing apparatus includes four process chambers 1a to 1d in each of which there is to be carried out semiconductor wafer processing such as etching and film-depositing. These four process chambers 1a to 1d are disposed in a circle having a diameter $D_1$, and circumferentially equally spaced away from each other, namely circumferentially spaced away by 90 degrees. Each of the process chambers 1a to 1d includes a first gate valve 8a to 8d, respectively, through which a wafer is transferred thereinto and taken out thereof, and a valve 9a to 9d for communicating each of the process chambers 1a to 1d to a later mentioned vacuum device. The process chambers 1a to 1d are rotatably supported on a rotary bearing 23.

There stands a main manifold at the center of the circle $D_1$, communicating to the process chambers 1a to 1d through branch manifolds 3a to 3d in hermetically sealed fashion. The main manifold 2 is connected to a vacuum device 10, and hence the process chambers 1a to 1d are able to be kept vacuous by the vacuum device 10 through the main and branch manifolds 2 and 3a to 3d. The main manifold 2 is connected to the vacuum device 10 through a rotary joint 11 so that the main manifold and hence the process chambers 1a to 1d can be rotated about the center of the circle $D_1$.

The process chambers 1a to 1d are rotated by an indexing device 12. The indexing device 12 also acts as a controller for the rotation of the process chambers 1a to 1d. That is, as mentioned later, the indexing device 12 rotates the process chambers 1a to 1d by 90 degrees, and stops them so that two of them face to the wafer transferring devices 5a and 5b.

As illustrated in FIG. 4A, similarly to the first and second embodiments, the semiconductor wafer processing apparatus includes the wafer transferring devices 5a and 5b disposed in a circle having a diameter $D_2$ greater than the diameter $D_1$. The wafer transferring devices 5a and 5b are circumferentially spaced away from each other by 90 degrees. Thus, the first and second wafer transferring devices 5a and 5b face to the process chambers 1a and 1d, respectively.

The wafer transferring devices 5a and 5b include wafer transfer chambers 13a and 13b, and load rock chambers 14a and 14b in communication with the wafer transfer chambers 13a and 13b. The wafer transfer chambers 13a and 13b have second gate valves 15a and 15b disposed facing to the first gate valves 8a and 8d of the process chambers 1a and 1d, and third gate valves 16a and 16b through which the wafer transfer chambers 13a and 13b are in communication with the road lock chambers 14a and 14b.

Each of the wafer transferring devices 5a and 5b also includes an extensible and contractible bellows 17a, 17b connected to the second gate valves 15a and 15b for connecting the second gate valves 15a and 15b to the first gate valves 8a and 8d of the process chambers 1a and 1d in hermetical sealed fashion, and disconnecting the wafer transferring devices 5a and 5b from the first gate valves 8a and 8d.

The load rock chambers 14a and 14b are provided with doors 18a and 18b through which cassettes 19a and 19b containing a plurality of non-processed wafers 20a and processed wafers 20b therein are to be transferred into and taken out of the load rock chambers 14a and 14b, respectively. As illustrated in FIG. 4B, there are provided elevators 21a and 21b (only elevator 21a is illustrated) for transferring the cassettes 19a and 19b between the load rock chambers 14a, 14b and outside.

In the wafer transfer chambers 13a and 13b are provided wafer transferring arms 22a and 22b for transferring the non-processed wafers 20a one by one into the process chamber 1a and taking the processed wafer 20b out of the process chamber 1d through the first and second gate valves 8a, 8d and 15a, 15b, and also for transferring the wafers 20a and 20b between the wafer transfer chambers 13a, 13b and the load rock chambers 14a, 14b through the third gate valves 16a and 16b.

As illustrated in FIG. 4B, in each of the process chambers 1a to 1d are provided upper electrodes 24a to 24d (only 24a is illustrated) and lower electrodes 25a to 25d (only 25a is illustrated) on which the non-processed wafer 20a to be processed is to be placed. A high frequency power supply 26 applies high frequency voltage across the upper and lower electrodes 24a to 24d and 25a to 25d. A gas supply 27 introduces process gas into each of the process chambers 1a to 1d.

Additional vacuum devices (not illustrated) may be provided for independently evacuating the wafer transferring chambers 13a to 13d and the load rock chambers 14a to 14d.

The indexing device 12 is comprised of a ring gear connected to an outer race of the rotary bearing 23 on which the process chambers 1a to 1d are mounted, pinion gears and a stopper pin. The indexing device 12 rotates the process chambers 1a to 1d by 90 degrees in a direction indicated with an arrow A1, and stops the process chambers 1a to 1d so that two of them face to the wafer transferring devices 5a and 5b.

When the process chambers 1a to 1d are rotated, the bellows 17a to 17d are made to be contracted by air cylinders (not illustrated) to avoid interference between the process chambers 1a to 1d and the wafer transferring devices 5a and 5b, and when the process chambers 1a and 1d are to be connected to the wafer transferring devices 5a and 5b in hermetically sealed fashion, the air cylinders extend to thereby expand the bellows 17a and 17b to connect the wafer transferring devices 5a and 5b with the process chambers 1a and 1d, respectively. Herein, the wafer transferring arms 22a and 22b are constituted of conventional toggle mechanism and swing mechanism.

In operation, the evacuated cassette 17a containing a plurality of the non-processed wafers 20a is transferred into the load rock chamber 14a by the elevator 21a, the empty cassette 17b in which the processed wafers 20b are to be contained is transferred into the load rock chamber 14b by the elevator 21b. The wafer transferring arm 22a takes out one of the non-processed wafers 20a from the cassette 19a through the third gate valve 16a which was made open in advance, and then transfers the non-processed wafer 20a into the depressurized process chamber 1a positioned at A through the evacuated wafer transfer chamber 13a, the second gate valve 15a, the bellows 17a, and the first gate valve 8a. After introduction of the non-processed wafer 20a into the process chamber 1a, the process chambers 1a and 1d are rotated by 90 degrees by the indexing device 12. Thus, the process chamber 1a moves to the position B, and the process chamber 1d moves to the position A at which the process chamber 1d faces to the wafer transferring device 5a. The wafer processing such as etching is carried out in the process chamber 1a at the position B.

At the same time, the wafer transferring device 5a transfers the single non-processed wafer 20a into the process chamber 1d. Then, the process chambers 1a to 1d are rotated by 90 degrees by the indexing device 12, thereby the process chamber 1d being rotated to the position B and the process chamber 1a containing the wafer 20b having been processed being rotated to the position C.

When the process chamber 1a are rotated to the position D at which the process chamber 1a faces to the wafer transferring device 5b, the bellows 17b is extended to cause a flange of the bellows 17b to contact to a flange of the first gate valve 8a in hermetically sealed fashion. Then, the first and second gate valves 8a and 5b are made open. Then, the wafer transfer arm 22b takes the processed wafer 20b out of the process chamber 1a and then transfers into the wafer transfer chamber 13b which was evacuated in advance.

Then, the second gate valve 8b is closed and the bellows 17b is contracted. Then, the process chambers 1a to 1d are rotated by 90 degrees by the indexing device 12, thereby the empty process chamber 1a rotating to the position A. At the same time, the wafer transfer arm 22b transfers the processed wafer 20b to the evacuated load rock chamber 14b through the third gate valve 16b which was made open. The thus transferred processed wafers 20b is introduced into the empty cassette 19b.

The above mentioned steps are repeated until all the non-processed wafers 20a are transferred into any of the process chambers 1a to 1d and thus the cassette 19a is made empty, and also until the cassette 19b in the load rock chamber 14b is filled with the processed wafers 20b. Hereinafter, the third gate valves 16a and 16b are closed, and the load rock chambers 14a and 14b are controlled to have atmospheric pressure. Then, the doors 18a and 18b are open, and both the empty cassette 19a and the cassette 19b containing the processed wafers 20b are lowered with the elevators 21a and 21b.

Then, a plurality of non-processed wafers 20a are introduced into the cassette 19a, which is in turn transferred into the load rock chamber 14a through the elevator 21l. The empty cassette 19b is transferred into the load rock chamber 14b through the elevator 21b. Finally, the load rock chambers 14a and 14b are evacuated again.

Similarly to the first and second embodiments, the semiconductor wafer processing apparatus made in accordance with the third embodiment makes it possible to successively carry out wafer processing without time loss.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A semiconductor wafer processing apparatus comprising:

N process chambers for processing a semiconductor wafer therein wherein N is a positive integer greater than 1, said N process chambers being disposed in a circle having a first diameter and circumferentially spaced away from each other by 360/N degrees, said N process chambers being supported for rotation about a center of said circle;

at least one pair of wafer transferring devices for transferring a semiconductor wafer into one of said N process chambers and taking a semiconductor wafer out of one of said N process chambers, said wafer transferring devices being disposed in a circle having a second diameter greater than said first diameter, said wafer transferring devices being circumferentially spaced away from each other by 360M/N degrees wherein M is a positive integer ranging from 1 to (N−1) both inclusive; and a driver for rotating said N process chambers about said center so that any two process chambers among said N process chambers face to said wafer transferring devices.

2. The semiconductor wafer processing apparatus as set forth in claim 1, wherein one of said pair of wafer transferring devices only transfers a semiconductor wafer into one of said N process chambers, and the other only takes a semiconductor wafer out of one of said N process chambers.

3. The semiconductor wafer processing apparatus as set forth in claim 2, wherein said pair of wafer transferring devices are the same in structure.

4. The semiconductor wafer processing apparatus as set forth in claim 1, wherein said driver rotates said N process chambers by 360/N degrees.

5. The semiconductor wafer processing apparatus as set forth in claim 1 further comprising a vacuum device for evacuating said N process chambers.

6. The semiconductor wafer processing apparatus as set forth in claim 5 further comprising a main manifold standing at said center of said circle and branch manifolds each of which communicates said main manifold to each of said N process chambers, said main manifold being rotatably connected to said vacuum device in hermetically sealed fashion.

7. The semiconductor wafer processing apparatus as set forth in claim 6, wherein said main manifold is connected to said vacuum device through a rotary joint.

8. The semiconductor wafer processing apparatus as set forth in claim 1, wherein each of said wafer transferring devices has a portion capable of extending to one of said N process chambers to make contact therewith to communicate said wafer transferring device to said one of said N process chambers, and drawing from one of said N process chambers to make spacing therebetween.

9. The semiconductor wafer processing apparatus as set forth in claim 8, wherein said portion of said wafer transferring devices is comprised of a bellows.

10. A semiconductor wafer processing apparatus comprising:

N process chambers for processing a semiconductor wafer therein wherein N is an even integer greater than 1, said N process chambers being disposed in a circle having a first diameter and circumferentially spaced away from each other by 360/N degrees, said N process chambers being supported for rotation about a center of said circle;

N/2 wafer transferring devices for transferring a semiconductor wafer into one of said N process chambers and taking a semiconductor wafer out of one of said N process chambers, said wafer transferring devices being disposed in a circle having a second diameter greater than said first diameter, said wafer transferring devices being circumferentially spaced away from each other by 720/N degrees and disposed facing to alternately disposed process chambers among said N process chambers; and a driver for rotating said N process chambers about said center in opposite directions.

11. The semiconductor wafer processing apparatus as set forth in claim 10, wherein said driver rotates said N process chambers by 180/N degrees.

12. The semiconductor wafer processing apparatus as set forth in claim 10 further comprising a vacuum device for evacuating said N process chambers.

13. The semiconductor wafer processing apparatus as set forth in claim 12 further comprising a main manifold standing at said center of said circle and branch manifolds each of which communicates said main manifold to each of said N process chambers, said main manifold being rotatably connected to said vacuum device in hermetically sealed fashion.

14. The semiconductor wafer processing apparatus as set forth in claim 13, wherein said main manifold is connected to said vacuum device through a rotary joint.

15. The semiconductor wafer processing apparatus as set forth in claim 10, wherein each of said wafer transferring devices has a portion capable of extending to one of said N process chambers to make contact therewith to communicate said wafer transferring device to said one of said N process chambers, and drawing from one of said N process chambers to make spacing therebetween.

16. The semiconductor wafer processing apparatus as set forth in claim 15, wherein said portion of said wafer transferring devices is comprised of a bellows.

17. The semiconductor wafer processing apparatus as set forth in claim 10, wherein each of said wafer transferring devices includes a wafer transferring arm for transferring a semiconductor wafer into one of said N process chambers and taking a semiconductor wafer out of one of said N process chambers.

18. A semiconductor wafer processing apparatus comprising:

a plurality of process chambers disposed in a circle for processing a wafer therein, each of said process chambers including a first gate valve through which a wafer is transferred thereinto and a wafer is taken out thereof, and a valve for communicating each of said process chambers to outside, said process chambers being circumferentially equally spaced away from each other;

a main manifold standing at a center of said circle, all of said valves being communicated to said main manifold;

a vacuum device rotatably connected to said main manifold in hermetically sealed fashion for evacuating said process chambers through said main manifold and said valves;

positioning means for positioning said process chambers by rotating said process chambers about said center of said circle and stopping said process chambers at a predetermined position;

a pair of wafer transfer chambers for transferring a semiconductor wafer into one of said process chambers therethrough and taking a semiconductor wafer out of one of said process chambers therethrough, each of said wafer transfer chambers including a second gate valve located in facing relation to said first gate valve of said process chamber positioned by said positioning means, and a third gate valve at a rear end of said wafer transfer chambers;

extensible and contractible bellows connected to said second gate valves for connecting said first gate valves to said second gate valves and disconnecting said first gate valves from said second gate valves in hermetical sealed fashion; and a wafer transferring arm provided in each of said wafer transfer chambers for transferring a semiconductor wafer into one of said process chambers and taking a semiconductor wafer out of one of said process chambers, and also for transferring a semiconductor wafer to outside through said third gate valve and taking a semiconductor wafer from outside thereinto.

19. The semiconductor wafer processing apparatus as set forth in claim 18, wherein said main manifold is connected to said vacuum device through a rotary joint.

20. The semiconductor wafer processing apparatus as set forth in claim 18 further comprising an elevator for transferring a plurality of semiconductor wafers to said wafer transfer chamber.

21. The semiconductor wafer processing apparatus as set forth in claim 18, wherein said process chambers are rotated in opposite directions.

22. A method of processing a semiconductor wafer comprising the steps of:

(a) preparing N process chambers for processing a semiconductor wafer therein wherein N is a positive integer greater than 1, said N process chambers being disposed in a circle and circumferentially spaced away from each other by 360/N degrees, said N process chambers being supported for rotation about a center of said circle;

(b) transferring a semiconductor wafer at a first location into a first process chamber among said N process chambers;

(c) rotating said N process chambers by 360M/N degrees wherein M is a positive integer ranging from 1 to (N−1) both inclusive;

(d) carrying out processing of a semiconductor wafer in said first process chamber;

(e) transferring a semiconductor wafer at said first position into a second process chamber among said N process chambers;

(f) repeating said steps (c) to (e) for subsequent semiconductor wafers;

(g) taking a processed semiconductor wafer out of said first process chamber at a second location which is circumferentially spaced away from said first location by 360L/N degrees wherein L is a positive integer ranging from 1 to (N−1) both inclusive; and (h) repeating said steps (b) to (g).

23. The method of processing a semiconductor wafer as set forth in claim 22 wherein said steps (d) and (e) are to be concurrently carried out.

24. A method of processing a semiconductor wafer comprising the steps of:

(a) preparing N process chambers for processing a semiconductor wafer therein wherein N is an even integer greater than 1, said N process chambers being disposed in a circle and circumferentially spaced away from each other by 360/N degrees, said N process chambers being supported for rotation about a center of said circle;

(b) transferring a semiconductor wafer into alternately disposed process chambers among said N process chambers when said N process chambers are in a first position;

(c) rotating said N process chambers to a second position in a direction;

(d) carrying out processing of a semiconductor wafer in said process chambers;

(e) rotating said N process chambers in an opposite direction back to said first position;

(f) taking processed semiconductor wafers out of said process chambers and transferring unprocessed semiconductor wafers into said process chambers; and (g) repeating said steps (c) to (f).

* * * * *